US012575330B2

(12) United States Patent
Hu et al.

(10) Patent No.: US 12,575,330 B2
(45) Date of Patent: Mar. 10, 2026

(54) ORDERED ALLOY MAGNETIC TUNNEL JUNCTION WITH SIMPLIFIED SEED STRUCTURE

(71) Applicant: International Business Machines Corporation, Armonk, NY (US)

(72) Inventors: Guohan Hu, Yorktown Heights, NY (US); Matthias Georg Gottwald, Ridgefield, CT (US); John Bruley, Poughkeepsie, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 18/097,194

(22) Filed: Jan. 13, 2023

(65) Prior Publication Data

US 2024/0244982 A1     Jul. 18, 2024

(51) Int. Cl.
        *H10N 50/10* (2023.01)
        *H10B 61/00* (2023.01)
        *H10N 50/01* (2023.01)
        *H10N 50/85* (2023.01)
(52) U.S. Cl.
        CPC ............. *H10N 50/10* (2023.02); *H10B 61/00* (2023.02); *H10N 50/01* (2023.02); *H10N 50/85* (2023.02)
(58) Field of Classification Search
        CPC .... G01R 33/098; H10N 50/10; G11B 5/3909; G11C 2211/5615; G11C 11/161
        See application file for complete search history.

(56) References Cited

U.S. PATENT DOCUMENTS

| | | | |
|---|---|---|---|
| 10,193,062 B2 | 1/2019 | Iwata | |
| 10,340,442 B2 | 7/2019 | Hase | |
| 11,088,319 B2 | 8/2021 | Kim | |
| 11,107,978 B2 | 8/2021 | Araki | |
| 11,417,835 B2 | 8/2022 | Iwata | |
| 2008/0182342 A1* | 7/2008 | Parkin | B82Y 10/00 |
| | | | 257/E21.001 |
| 2017/0117458 A1* | 4/2017 | Sonobe | H10B 61/22 |
| 2017/0294482 A1* | 10/2017 | Hu | H10N 50/01 |

(Continued)

FOREIGN PATENT DOCUMENTS

| | | |
|---|---|---|
| JP | 2015207593 A | 11/2015 |
| WO | 2022093324 A1 | 5/2022 |

OTHER PUBLICATIONS

Hirohata, A., Frost, W., Samiepour, M., & Kim, J. Y. (Jan. 2018). Perpendicular Magnetic Anisotropy in Heusler Alloy Films and Their Magnetoresistive Junctions. Materials, 11(1), 105. See highlighted sections. 18 pages.

(Continued)

*Primary Examiner* — Christine S. Kim
*Assistant Examiner* — Cole Leon Lindsey
(74) *Attorney, Agent, or Firm* — Yuanmin Cai; Otterstedt & Kammer PLLC

(57) ABSTRACT

Magnetic tunnel junction pillars including ordered alloy, bottom free layers are formed using simplified seed structures including textured magnesium oxide. The seed structures can have relatively small thicknesses, thereby reducing roughness of layers formed above the seed structures and facilitating magnetic tunnel junction pillar formation from multi-layer films including such seed structures.

20 Claims, 3 Drawing Sheets

(56)         References Cited

U.S. PATENT DOCUMENTS

2018/0268887 A1      9/2018   Endo
2019/0305040 A1*   10/2019   Jeong ..................... H10B 61/00

OTHER PUBLICATIONS

Ma, Q., Sugihara, A., Suzuki, K., Zhang, X., Miyazaki, T., & Mizukami, S. (Dec. 2014). Tetragonal Heusler-Like Mn—Ga Alloys Based Perpendicular Magnetic Tunnel Junctions. In Spin (vol. 4, No. 04, p. 1440024). World Scientific Publishing Company. See highlighted sections. 15 pages.

* cited by examiner

Figure 2:
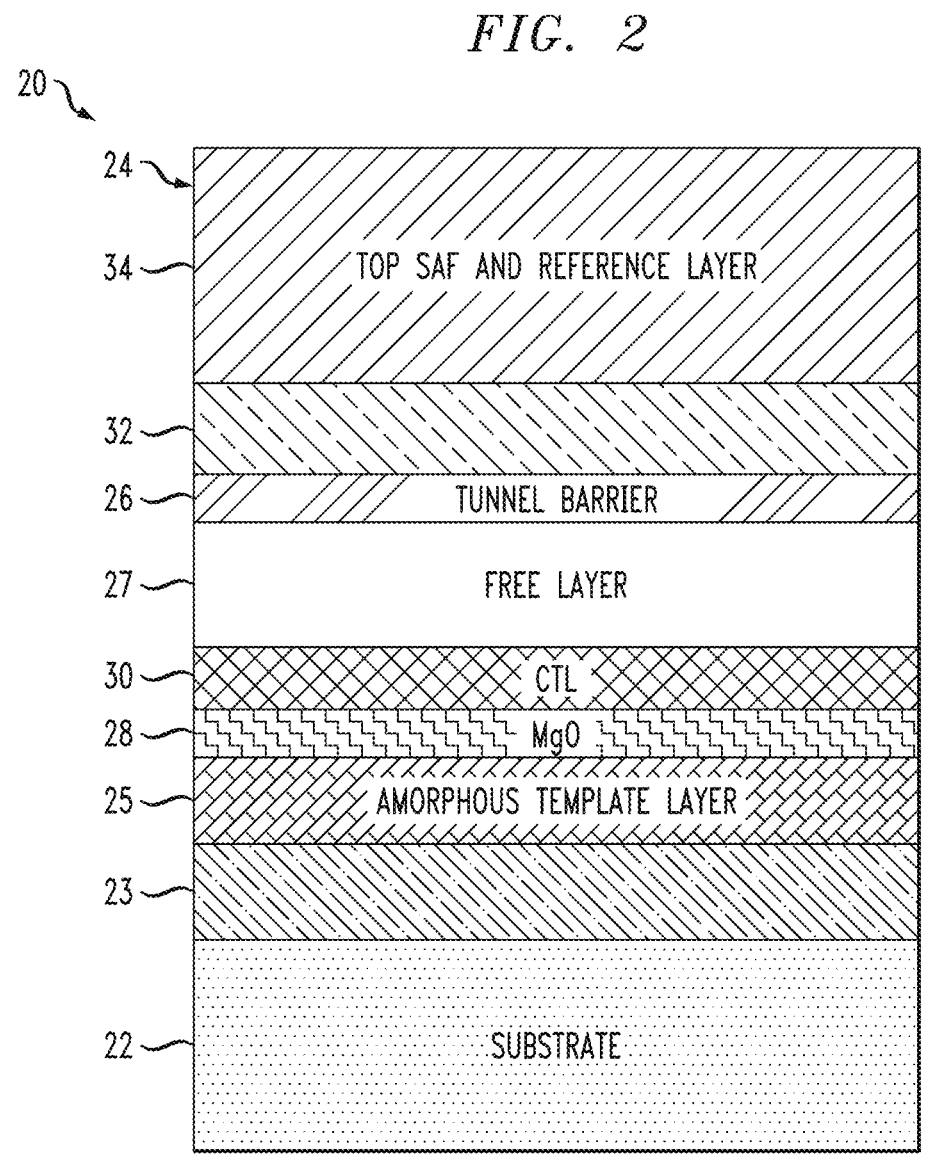

24
34 — TOP SAF AND REFERENCE LAYER

32

26 — TUNNEL BARRIER

27 — FREE LAYER

30 — CTL

28 — MgO

25 — AMORPHOUS TEMPLATE LAYER

23

22 — SUBSTRATE

ORDERED ALLOY MAGNETIC TUNNEL JUNCTION WITH SIMPLIFIED SEED STRUCTURE

BACKGROUND

The present invention relates generally to the electrical, electronic and computer arts and, more particularly, to the magnetic tunnel junction (MTJ) pillars having simplified seed structures and ordered alloy materials as a free layers.

Magnetic tunnel junction stacks are suitable for use in various electronic applications, including non-volatile memory devices and magnetic field sensors. Magnetic random access memory (MRAM) can, for example, offer faster operational speed than flash memory. MRAM devices may be able to replace dynamic random access memory (DRAM) devices in some applications.

Magnetic tunnel junctions include two magnetic layers and a tunnel barrier layer positioned between the magnetic layers. The magnetic layers can be characterized as "reference" and "free" layers, respectively while the tunnel barrier can be a thin tunneling oxide layer. The magnetization direction of one layer of the junction is fixed so that it serves as the reference layer. The magnetization of the free layer can be determined by an electrical input. A MTJ includes two stable resistance states. Charge current from the reference layer to the free layer causes the MTJ to switch between states by overcoming the energy barrier.

Fabrication of MTJ pillars with ordered alloy free layers has typically required forming a thick multilayer seed layer stack comprising, for example, MnN and CoAl having a combined thickness of about five hundred Angstroms. Alternatively, a relatively thick multilayer seed layer stack may comprise ScN, Cr, IrAl, and CoAl. A free layer, a tunnel barrier, and a reference layer are formed over the seed layer. Crystalline MgO tunnel barriers grown on an amorphous layers can obtain an oriented (100) texture and provide a relatively high TMR (tunneling magnetoresistance) ratio. When using a spin-torque-transfer (STT) MTJ, the difference in the tunneling current, as the spin alignment of the free and pinned layers is switched between being parallel (P) and anti-parallel (AP), is known as a tunnel magneto-resistance (TMR) ratio.

Ion beam etching (IBE) allows the etching of stacks of multiple materials where the vapor pressure of the materials to be removed is negligible, but can leave metallic residues that adversely affect performance. For IBE processing of MTJ pillars, the amount and size of residues is a function of the etch pattern density and the etch depth.

SUMMARY

A method of forming a pillar including a magnetic tunnel junction is provided in accordance with one aspect of the invention. The method includes obtaining a substrate including a substrate layer and an amorphous template layer over the substrate layer, forming a (001)-textured magnesium oxide seed layer on the amorphous template layer, and forming a crystalline, non-magnetic chemical templating layer on the (001)-textured magnesium oxide seed layer, the crystalline, non-magnetic chemical templating layer and the (001)-textured magnesium oxide seed layer having a combined thickness of less than 100 Å. The method further includes forming an ordered alloy free layer on the crystalline, non-magnetic chemical templating layer, forming a tunnel barrier on the ordered alloy free layer, and forming a reference structure over the tunnel barrier.

In some embodiments of the method, the crystalline, non-magnetic chemical templating layer comprises CoAl and forming the free layer includes forming tensile strained $Mn_3Ge$ on the crystalline, non-magnetic chemical templating layer. In a further embodiment of the method, the tunnel barrier comprises (001)-textured magnesium oxide and the method includes forming the (001)-textured magnesium oxide seed layer, the crystalline, non-magnetic chemical templating layer, the free layer, and the tunnel barrier as a layered stack having substantially uniform crystallinity. Ion beam etching may be employed to form the pillar from a multi-layer blanket structure.

In a further aspect, a multi-layer pillar includes a (001)-textured magnesium oxide seed layer, a crystalline, non-magnetic chemical templating layer on the (001)-textured magnesium oxide seed layer, a free layer comprising an ordered magnetic alloy on the crystalline, non-magnetic chemical templating layer, a tunnel barrier on the free layer, and a reference structure over the tunnel barrier. The free layer, the tunnel barrier, and the reference structure form a magnetic tunnel junction.

The (001)-textured magnesium oxide seed layer, the crystalline, non-magnetic chemical templating layer, the free layer, and the tunnel barrier comprise a layered stack having substantially uniform crystallinity in an exemplary multi-layer pillar. The ordered magnetic alloy includes a Heusler alloy in some embodiments. The (001)-textured magnesium oxide seed layer and the crystalline, non-magnetic chemical templating layer may have a combined thickness of less than 100 Å. The crystalline, non-magnetic chemical templating layer has a greater lattice constant than the lattice constant of the free layer in some embodiments of the invention. For example, the ordered magnetic alloy forming the free layer may comprise tensile strained $Mn_3Ge$ and the crystalline, non-magnetic chemical templating layer may comprise CoAl.

A multi-layer pillar in accordance with a further aspect includes a template layer and a magnetic tunnel junction. The magnetic tunnel junction includes a free layer including an ordered magnetic alloy, a tunnel barrier on the free layer, and a reference structure over the tunnel barrier. A seed layer structure having a thickness of 100 Å or less is between the template layer and the magnetic tunnel junction. The seed layer structure includes a (001)-textured magnesium oxide seed layer on the template layer and a crystalline, non-magnetic chemical templating layer on the (001)-textured magnesium oxide seed layer. The crystalline, non-magnetic chemical templating layer contacts the free layer of the magnetic tunnel junction. The ordered magnetic alloy may include a Heusler alloy such as $Mn_3Ge$. The crystalline, non-magnetic chemical templating layer has a thickness of at least 10 Å and comprises CoAl in some embodiments, though other compounds or layers of compounds may instead be employed. The ordered magnetic alloy is tensile strained in some embodiments, such as in embodiments wherein a $Mn_3Ge$ free layer is formed on a CoAl chemical templating layer. The (001)-textured magnesium oxide seed layer, the crystalline, non-magnetic chemical templating layer, the free layer, and the tunnel barrier form a layered stack having substantially uniform crystallinity in some exemplary embodiments.

Techniques and structures as disclosed herein can provide substantial beneficial technical effects. By way of example only and without limitation, one or more embodiments may provide one or more of the following advantages:

Fast switching times;

Ordered alloy free layer having low magnetic moment, which allows fast switching;

Tensile strained free layer;

Prevention of spin pumping;

Thin seed layer to reduce roughness of subsequent layers and reduce metallic residue;

Short MTJ pillars that facilitate integration of memory devices between M2 and M3 interconnect layers, near the FEOL layer.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 2 is a schematic, cross-sectional view showing an exemplary MTJ pillar that may be obtained following the process illustrated in FIG. 1.

Figure 1:
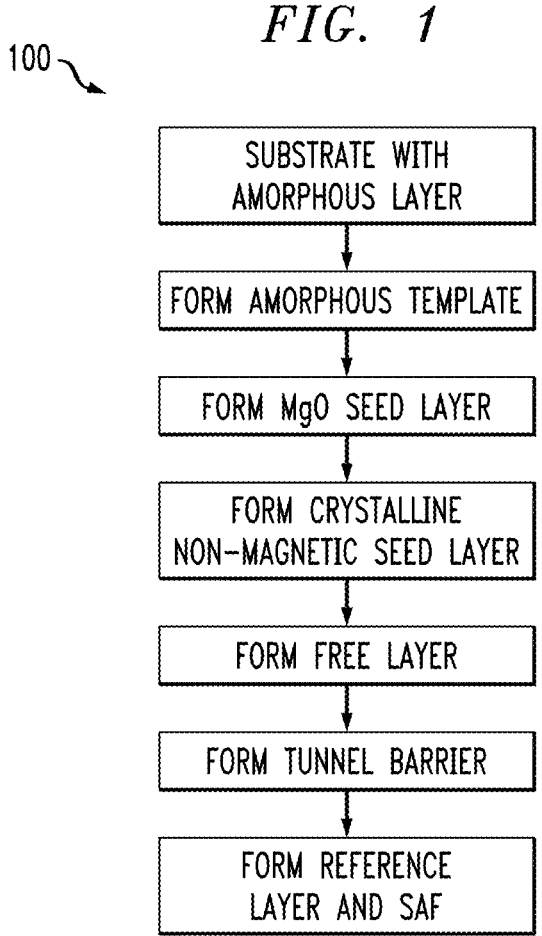
FIG. 1 is a flow diagram showing stages of a fabrication process for forming an exemplary MTJ pillar.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Spin-transfer torque magnetic random-access memory (STT-MRAM) is an advanced nonvolatile memory that benefits from fast switching times (<10 ns) and even faster switching times (~2 ns) for last level cache or eDRAM replacement. Magnetic tunnel junction (MTJ) stacks for providing STT-MRAM devices with such fast switch times need to have a low moment while still providing a sufficiently high tunnel magnetoresistance (TMR). Ordered alloys allow fast switching times as they provide the required magnetic properties. Relatively thin layers of magnetic material will have a low magnetic moment, which is desirable for obtaining fast switch times. The magnetic material forming the free layer should, in addition to having a low magnetic moment, provide significant retention. $Mn_3Ge$ is a good choice for the free layer of a MTJ stack as it is a ferrimagnetic system, meaning its magnetization can be relatively low. For example, ordered $Mn_3Ge$ free layers can be engineered to have a low magnetic moment and very high effective anisotropy field. Moreover, $Mn_3Ge$ can also be engineered for good retention (e.g. about 50 kBT for a memory device having a diameter of about 35 nm) while having a low magnetic moment. It will be appreciated that the intrinsic magnetization of $Mn_3Ge$ is not a given and that it may change with composition details and strain. The anisotropy field may likewise change depending on intrinsic magnetization and strain, and may be greater than 4 T.

CoFeB free layers have been employed in MTJ stacks and have been shown to provide reliable switching. Bulk $Mn_3Ge$ forming a thick, unstrained film has a magnetization of about one tenth of CoFeB. Engineered $Mn_3Ge$ films can have one fifth the magnetization of CoFeB down to zero net magnetization. While MTJ devices having CoFeB free layers can provide fast write times, an advantage of $Mn_3Ge$ over CoFeB and other high moment magnetic materials is the reduced penalty to pay in terms of higher switching voltages and currents when reducing write times. Write times of less than twenty nanoseconds (20 ns) are desirable in STT-MRAM operations. High write speeds of 10 ns or less may be obtainable using MTJ pillars in accordance with one or more embodiments of the invention.

Magnetic alloys comprising Heusler materials can be used as free layers in MTJ stacks if grown on highly textured and ordered seed layer materials. The seed layer needs to "force" the ordered alloy (e.g. $Mn_3Ge$) into a desired structure, which in the case of $Mn_3Ge$ is a tetragonal structure with the long axis being perpendicular to the film plane. The seed layer should also have a lattice constant that provides strain to the ordered alloy.

Tensile strain of a $Mn_3Ge$ free layer is desired as the spin polarization of the strained compound is greater than that of bulk $Mn_3Ge$. Bulk $Mn_3Ge$ has a lattice constant of 3.82 Å and the spin polarization is about 58%. If the $Mn_3Ge$ lattice is "stretched" above 4 Å, the spin polarization increases to about 90%. High spin polarization is necessary for reducing the switching current and for a low read current. A $Mn_3Ge$ free layer accordingly should be grown on a crystalline template having a lattice constant larger than 4 Å to facilitate ordered growth of such a free layer.

MTJ stack films can be deposited using, for example, physical vapor deposition (PVD), ion beam deposition (IBD) or other techniques. The patterning of the MTJ stack films to form pillars, one of which is shown in FIG. 2, is accomplished by a stack etching process. Ion milling (ion beam etching or IBE) is a known MTJ stack etching technique. As indicated above, the amount and size of residues on the MTJ pillar walls that result from IBE processing are functions of the etch pattern density and the etch depth. The techniques described below allow a reduction in the etch depth of an MTJ stack film.

Access times and overall circuit performance can be potentially improved by integrating memory devices close to the FEOL layer rather than in special sections on a chip. An MRAM is one type of memory device that can be integrated with BEOL CMOS processing just above the FEOL layer, for example between the M2 and M3 lines or layers. Silicon-based devices typically include multiple interconnect metallization layers above a device (front-end-of-line/FEOL) layer that contains field-effect transistors (FETs) or other structures. Middle-of-line (MOL) processing includes steps typically used for fabricating metal contacts for logic circuitry components such as field-effect transistors (FETs), resistors, diodes, and capacitors.

Back-end-of-line (BEOL) processing involves the creation of metal interconnecting wires that connect the devices formed in FEOL processing to form electrical circuits. The metal lines including the interconnecting wires are deposited in sequence (e.g. M1, M2, M3, etc.) above the FEOL layer and include dielectric layers comprising trenches and vias therein that are filled with electrical conductors. In view of the limited spaces between BEOL layers, it is beneficial if the heights of memory devices incorporated within such spaces are minimized. As discussed further below, MTJ pillars as described herein are relatively small in height, thereby facilitating their use between BEOL layers and also potentially reducing issues relating to residue formed on the MTJ pillars by ion beam etching. MTJ pillars having reduced heights as discussed below allow MRAM devices comprising the MTJ pillars to be located only short distances from the transistors in the FEOL layer, some of which may be employed for controlling memory devices comprising MTJ pillars.

Referring again to the exemplary structure 20 shown in FIG. 2, an MTJ pillar 24 is shown following deposition and patterning of a hard mask (not shown) and ion beam etching of an MTJ stack film (not shown) deposited over a substrate layer 22, for example a silicon or silicon oxide substrate layer. The substrate layer may comprise a BEOL interconnect layer. The etching of the MTJ stack film results in the formation of vertical pillars 24 from the stack film, each of the pillars including a magnetic tunnel junction comprised of a tunnel barrier layer 26 formed over a free layer 27. Magnesium oxide (MgO) forms the tunnel barrier layer in an exemplary structure. The free layer 27 may be formed of magnetically active metal such as an ordered magnetic alloy, and may comprise multiple layers. FIG. 1 shows an exemplary process flow for forming a MTJ stack film from which MTJ pillars as shown in FIG. 2 may be formed. In one exemplary embodiment, MTJ stack film is deposited on an M2/F2 (Metal 2/Fatwire dielectric 2) substrate layer and the vertical MTJ pillars are formed from the MTJ stack film.

The exemplary process 100 includes a starting structure comprising an amorphous layer on the substrate layer 22. A bottom amorphous layer 23 may comprise, for example, a tantalum or tantalum nitride (TaN) layer deposited on the substrate layer 22 by a physical vapor deposition (PVD), sputtering or other suitable process. Such amorphous films are known to the art. The bottom amorphous layer 23 may have a thickness of about 20 Å. A thin, amorphous template layer 25 is formed on the bottom amorphous layer 23. The amorphous template layer comprises CoFeB in an exemplary embodiment and may be deposited by sputtering. The amorphous template layer may have a thickness of about 5 Å. A ZrCo amorphous template layer may be used in an alternative embodiment. It will be noted that the amorphous layer 25 only needs to be amorphous upon deposition and during subsequent deposition of an MgO seed layer as described below. The amorphous template layer 25 may crystallize later in the process such that the final structure may include a crystalline layer beneath the MgO seed layer.

A highly textured (001) oriented structure is naturally formed when magnesium oxide (MgO) is deposited on an amorphous template layer such as amorphous CoFeB. A thin MgO seed layer 28 is deposited on the amorphous template layer 25, naturally forming a highly textured, cubic (NaCl-like) structure with a lattice constant of 4.25 Å. As discussed below, the thin MgO seed layer 28, having a thickness of about 6-10 Å in exemplary embodiments, enables mainly (001)-textured CoAl crystallites to be formed thereon. In an exemplary embodiment, the MgO seed layer is deposited at ambient temperature by sputtering and has a thickness of three nanometers (3 nm) or less.

A chemical templating layer (CTL) 30 is deposited on the MgO seed layer 28. In an exemplary embodiment, the CTL

30 is a non-magnetic, crystalline CoAl layer deposited on the MgO seed layer 28 by sputtering. The CTL 30 in one exemplary embodiment is a stoichiometric CoAl alloy having a 50:50 atomic ratio. Stoichiometric CoAl alloy is a template that allows the growth of a Mn$_3$Ge free layer. When grown on MgO, CoAl having a 50:50 atomic ratio forms mainly (001) crystallites having a CsCl structure and lattice spacing in the (011) direction of 4.03 Å. The MgO seed layer 28, in addition to enabling mainly (001)-textured CoAl crystallites, is an electrical insulator that is non-magnetic and prevents spin pumping.

A tensile strained Mn$_3$Ge free layer 27 can be formed epitaxially on a CoAl CTL having the cubic CsCl structure obtained by growing the CoAl on the MgO seed layer 28. Terms "epitaxially growing and/or depositing" and "grown epitaxially" mean the growth of a material on a deposition surface in which the material being grown has the same crystalline characteristics as the deposition surface. In an epitaxial deposition process, the chemical reactants are controlled and the system parameters are set so that the depositing atoms arrive at the deposition surface of the semiconductor substrate with sufficient energy to move around on the surface and orient themselves to the crystal arrangement of the atoms of the deposition surface. The simplified seed layer structure comprising the MgO seed layer 28 and the CTL 30, which preferably has a thickness of less than 100 Å, facilitates the growth of an ordered alloy material such Mn$_3$Ge as a free layer. The thickness of a CoAl CTL in one exemplary embodiment is about 50 Å while the MgO seed layer has a thickness of 10 Å or less. The CTL 30 should have sufficient thickness to ensure proper texturing (tetragonal) of the subsequently grown free layer and the introduction of strain therein to avoid perpendicular magnetic anisotropy (PMA) loss or other degradation of magnetic properties. The thickness of the CoAl CTL 30 is preferably greater than ten Angstroms (10 Å).

In embodiments where the free layer comprises an ordered alloy having a lattice constant different from that of Mn$_3$Ge, a CTL having a difference lattice constant than that of CoAl may be employed. Ordered Heusler alloys besides Mn$_3$Ge may be employed as free layers (or as sublayers of multi-layer free layers) in some embodiments and may require different CTLs grown on MgO for providing the desired strain on the free layer. Such ordered magnetic alloys include, for example, Mn$_3$Ga, Co$_2$MnSn, Mn$_3$Sn, and Mn$_3$Sb. The term "ordered magnetic alloy" is understood as a magnetic alloy that has a lattice structure in which atoms of one element occupy particular sites and atoms of at least one other element occupy other sites.

Layers other than CoAl may be employed as chemical templating layers provided they have the CsCl structure, (001)-oriented texture, and appropriate lattice parameters. In embodiments wherein strain is to be provided on a Heusler alloy comprising the free layer, the lattice parameter of the CTL should be in a range that is sufficiently meaningful to strain the Heusler alloy towards the targeted lattice structure. In some embodiments, the CTL layer may comprise NiAl, IrAl, or CoGa. Multi-layer chemical templating layers comprising two or more distinct layers may be employed in further alternative embodiments. A multi-layer structure such as CoAl|CoIr|CoAl may form a chemical templating layer in one or more embodiments. It will be appreciated that if a Heusler alloy having ideal or satisfactory properties (e.g. high TMR and perpendicular magnetic anisotropy (PMA), low magnetic moment (Mst)) in an unstrained state were available, such an alloy would not require growth on a chemical templating layer that provides strain thereto.

As discussed above, tensile strain of a textured $Mn_3Ge$ free layer is desired as the spin polarization of the strained compound is greater than that of bulk $Mn_3Ge$. High spin polarization is necessary for reducing the switching current and for a low read current. The CoAl template as provided in accordance with the teachings herein, having a lattice constant greater than 4 Å, enables growth of a strained $Mn_3Ge$ free layer having a spin polarization of about ninety percent (90%). Free layers such as $Mn_3Ge$ free layers can be grown using various known processes, including sputtering. Bottom free layer MTJs, wherein the tunnel barrier and reference layer are formed above the free layer, are provided in one or more exemplary embodiments. The thin underlying seed layer structure comprising the MgO layer and the CTL, having a combined thickness of less than 100 Å, facilitate growth of subsequent layers layer without pinholes, in contrast to MTJ stacks grown using seed layers having thicknesses measuring in the hundreds of Angstrom units. The free layer may have a thickness of 8-80 Å.

Figure 3:
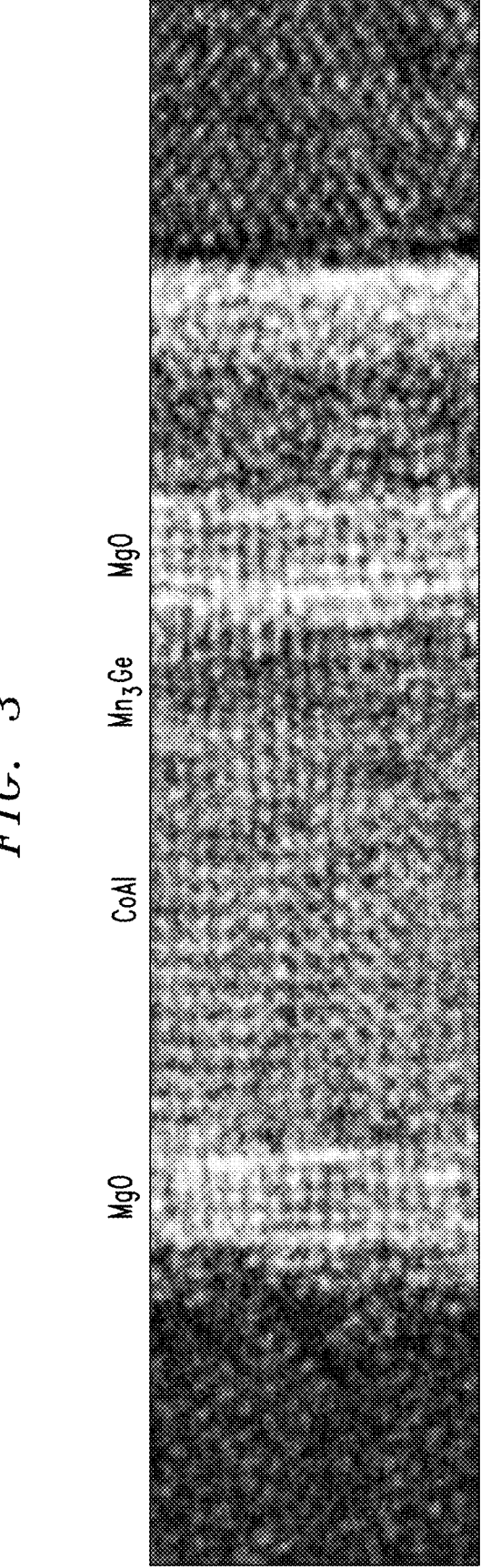
FIG. 3 is a greatly magnified view showing selected layers of an exemplary MTJ pillar.

A tunnel barrier 26 is grown on the free layer 27. The tunnel barrier 26 comprises a thin dielectric layer of barrier material. In an exemplary embodiment, the barrier material is a crystalline MgO layer having an (001) texture and a thickness of less than two nanometers (2 nm). MgO grown on $Mn_3Ge$ will, like the MgO seed layer, be (001)-textured. Grain formation differs from the manner in which MgO grains are obtained when grown on CoFeB in forming the MgO seed layer. If MgO is grown on an amorphous template layer such as a CoFeB layer, it forms grains which have a (001) texture, but which are randomly oriented with respect to the in-plane orientations. During anneal, the CoFeB crystallizes and the grains follow the MgO orientations. If MgO is grown on crystalline $Mn_3Ge$ as in an exemplary embodiment, the $Mn_3Ge$ grains (at least in an ideal case) determine the MgO grain size and in-plane orientation. The MgO aligns to the existing lattice of the $Mn_3Ge$. As shown in FIG. 3, the thin seed layer of the exemplary structure includes a well crystalled and textured CoAl CTL as grown on an MgO seed layer. The $Mn_3Ge$ free layer, grown epitaxially on the CoAl CTL, is textured and strained by both the CoAl and the textured MgO tunnel barrier, and has substantially uniform crystallinity throughout. $Mn_3Ge$ thin films have low magnetic moments per area (0.02 memu/$cm^2$) and high perpendicular anisotropy fields $H_k$.

The tunnel barrier 26 is sufficiently thin that quantum-mechanical tunneling of the charge carriers occurs between the adjoining magnetic layers. The barrier material may alternatively comprise other dielectric materials including, but not limited to, aluminum oxide ($AlO_x$) and titanium oxide ($TiO_x$), either of which can be deposited using standard sputtering techniques. In embodiments wherein the barrier material is crystalline MgO and the CTL is CoAl, the $Mn_3Ge$ free layer 27 has a desired tetragonal crystal structure, is strained by both the tunnel barrier 26 and the CoAl CTL 30, has a relatively low magnetic moment, and has high magnetic isotropy ($H_k$). The thin seed layer structure facilitates the growth of the tunnel barrier without degrading the TMR ratio. Imperfections that can propagate from relatively thick seed layers into subsequently deposited layers and cause the formation of a rough tunnel barrier base portion are reduced or avoided. As the tunnel barrier can be very thin, a base portion exhibiting surface roughness can adversely impact its performance.

A reference layer structure adjoins the tunnel barrier and may comprise multiple layers, including a pinning layer, ferromagnetic layers and a spacer layer between the ferromagnetic layers. When a bias is applied to the MTJ device, electrons that are spin polarized by the magnetic layers traverse the insulating barrier through a process known as quantum tunneling to generate an electric current, the magnitude of which depends on an orientation of magnetization of the magnetic layers. The MTJ device will exhibit a low resistance when a magnetic moment of the free layer is parallel to the fixed (reference) layer magnetic moment, and it will exhibit a high resistance when the magnetic moment of the free layer is oriented anti-parallel to the fixed layer magnetic moment. The reference layer structure in an exemplary embodiment includes a CoFeB layer 32 for creating spin polarization. It further includes a pinned synthetic antiferromagnetic ("SAF") layer 34 above the CoFeB layer. The CoFeB layer adjoins a reference layer including a multilayer-based synthetic antiferromagnet (SAF) structure. SAF structures include two magnetic layers antiferromagnetically coupled through a metallic spacer. CoFeB and SAF layers are known to the art and continue to be developed.

The MTJ pillars are encapsulated within a dielectric layer (not shown) formed from silicon oxide or a low-k dielectric material such as SiCOH. Chemical vapor deposition (CVD), including plasma-enhanced CVD, may be used for the deposition of low-k (k less than 4.0) dielectric materials such as porous SiCOH). The bottom electrodes of the MTJ pillars are electrically connected in some embodiments to a metal contact via Q1/V1 (not shown) which is, in turn, electrically connected to the M1/F1 layer (not shown). It will be appreciated that the techniques disclosed herein are applicable to the fabrication of MTJ-containing pillars having various configurations, including but not limited to double MTJ structures, and made from materials other than those described with respect to the exemplary pillar 24 described above. Pillars as described herein have various applications, including within STT-MRAM structures and SOT-MRAM (spin-orbit torque MRAM) structures.

As shown in FIG. 3, an MTJ pillar includes a layered stack having substantially uniform crystallinity throughout the free ($Mn_3Ge$) layer, its interfacing layers (the MgO tunnel barrier layer and the CoAl chemical templating layer), as well as the MgO seed layer that adjoins the CoAl seed layer. It will further be noted in this greatly magnified view that the formerly amorphous template layer (e.g. CoFeB) that adjoins the MgO seed layer of the exemplary MTJ pillar has also formed an at least partially crystallized structure.

With reference to the disclosure provided herein and the accompanying drawings, a multi-layer pillar 24 includes a (001)-textured magnesium oxide seed layer 28, a crystalline, non-magnetic chemical templating layer 30 on the (001)-textured magnesium oxide seed layer, a free layer 27 comprising an ordered magnetic alloy on the crystalline, non-magnetic chemical templating layer, a tunnel barrier 26 on the free layer, and a reference structure 32, 34 over the tunnel barrier. The free layer, the tunnel barrier, and the reference structure form a magnetic tunnel junction. In an exemplary embodiment as shown in FIG. 3, the (001)-textured magnesium oxide seed layer, the crystalline, non-magnetic chemical templating layer, the free layer, and the tunnel barrier comprise a layered stack having substantially uniform crystallinity. The ordered magnetic alloy includes a Heusler alloy in some embodiments. The (001)-textured magnesium oxide seed layer and the crystalline, non-magnetic chemical templating layer may have a combined thickness of less than 100 Å, thereby advantageously providing a relatively short MTJ pillar. The crystalline, non-magnetic chemical templating layer 30 has a greater lattice constant than the lattice constant of the free layer in some embodiments of the invention. The ordered magnetic alloy forming the free layer may comprise tensile strained $Mn_3Ge$ that is formed by using such a non-magnetic chemical templating layer, such as CoAl. A method of forming such a multi-layer pillar 20 includes forming the MgO seed layer 28 on an amorphous template layer 25, it being appreciated that the amorphous template layer may crystallize later in the fabrication process.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures such as memory devices including magnetic tunnel junctions formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A multi-layer pillar, comprising:
a (001)-textured magnesium oxide seed layer;
a crystalline, non-magnetic chemical templating layer on the (001)-textured magnesium oxide seed layer, the (001)-textured magnesium oxide seed layer and the crystalline, non-magnetic chemical templating layer having a combined thickness of less than 100 Å;
a free layer comprising an ordered magnetic alloy on the crystalline, non-magnetic chemical templating layer;
a tunnel barrier on the free layer; and
a reference structure over the tunnel barrier, wherein the free layer, the tunnel barrier, and the reference structure comprise a magnetic tunnel junction.

2. The multi-layer pillar of claim 1, wherein the (001)-textured magnesium oxide seed layer, the crystalline, non-magnetic chemical templating layer, the free layer, and the tunnel barrier comprise a layered stack having substantially uniform crystallinity.

3. The multi-layer pillar of claim 2, wherein the ordered magnetic alloy comprises a Heusler alloy.

4. The multi-layer pillar of claim 1, wherein the ordered magnetic alloy comprises a Heusler alloy.

5. The multi-layer pillar of claim 4, wherein the crystalline, non-magnetic chemical templating layer has a greater lattice constant than the lattice constant of the free layer.

6. The multi-layer pillar of claim 5, wherein the ordered magnetic alloy comprises $Mn_3Ge$, tensile strained by both the crystalline, non-magnetic chemical templating layer and the tunnel barrier, and the crystalline, non-magnetic chemical templating layer comprises CoAl.

7. The multi-layer pillar of claim 5, wherein:
the (001)-textured magnesium oxide seed layer has a thickness of 10 Å or less;
the crystalline, non-magnetic chemical templating layer has a thickness of at least 10 Å;
the free layer comprises a $Mn_3Ge$ layer, tensile strained by both the crystalline, non-magnetic chemical templating layer and the tunnel barrier; and
the tunnel barrier comprises magnesium oxide;
the (001)-textured magnesium oxide seed layer, the crystalline, non-magnetic chemical templating layer, the free layer, and the tunnel barrier comprising a layered stack having substantially uniform crystallinity.

8. A multi-layer pillar, comprising:
a template layer;
a magnetic tunnel junction comprising:
a free layer comprising an ordered magnetic alloy;
a tunnel barrier on the free layer; and
a reference structure over the tunnel barrier; and
a seed layer structure having a thickness of 100 Å or less between the template layer and the magnetic tunnel junction, the seed layer structure comprising:
a (001)-textured magnesium oxide seed layer on the template layer; and
a crystalline, non-magnetic chemical templating layer on the (001)-textured magnesium oxide seed layer and contacting the free layer of the magnetic tunnel junction.

9. The multi-layer pillar of claim 8, wherein the ordered magnetic alloy comprises a Heusler alloy.

10. The multi-layer pillar of claim 8, wherein the crystalline, non-magnetic chemical templating layer has a thickness of at least 10 Å and comprises CoAl.

11. The multi-layer pillar of claim 10, wherein the ordered magnetic alloy comprises tensile strained $Mn_3Ge$.

12. The multi-layer pillar of claim 8, wherein the (001)-textured magnesium oxide seed layer, the crystalline, non-magnetic chemical templating layer, the free layer, and the tunnel barrier comprise a layered stack having substantially uniform crystallinity.

13. The multi-layer pillar of claim 12, wherein the crystalline, non-magnetic chemical templating layer comprises CoAl.

14. The multi-layer pillar of claim 13, wherein the ordered magnetic alloy comprises $Mn_3Ge$.

15. The multi-layer pillar of claim 14, wherein the tunnel barrier comprises magnesium oxide.

16. A method of forming a pillar including a magnetic tunnel junction, comprising:
obtaining a substrate including a substrate layer and an amorphous template layer over the substrate layer;
forming a (001)-textured magnesium oxide seed layer on the amorphous template layer; and
forming a crystalline, non-magnetic chemical templating layer on the (001)-textured magnesium oxide seed layer, the crystalline, non-magnetic chemical templating layer and the (001)-textured magnesium oxide seed layer having a combined thickness of less than 100 Å;
forming an ordered alloy free layer on the crystalline, non-magnetic chemical templating layer;
forming a tunnel barrier on the ordered alloy free layer; and
forming a reference structure over the tunnel barrier.

17. The method of claim 16, wherein forming the pillar further includes:
providing a blanket structure including the amorphous template layer, the (001)-textured magnesium oxide seed layer; the crystalline, non-magnetic chemical templating layer, the ordered alloy free layer, the tunnel barrier and the reference structure; and
subjecting the blanket structure to ion beam etching to form the pillar.

18. The method of claim 16, wherein the crystalline, non-magnetic chemical templating layer comprises CoAl and wherein forming the free layer comprises forming tensile strained $Mn_3Ge$ on the crystalline, non-magnetic chemical templating layer.

19. The method of claim 16, wherein the free layer comprises an ordered Heusler alloy.

20. The method of claim 19, wherein the tunnel barrier comprises (001)-textured magnesium oxide, further including forming the (001)-textured magnesium oxide seed layer, the crystalline, non-magnetic chemical templating layer, the free layer, and the tunnel barrier as a layered stack having substantially uniform crystallinity.

*    *    *    *    *